US008227688B1

(12) United States Patent
Funcell (10) Patent No.: US 8,227,688 B1
(45) Date of Patent: *Jul. 24, 2012

(54) METHOD AND RESULTING STRUCTURE FOR ASSEMBLING PHOTOVOLTAIC REGIONS ONTO LEAD FRAME MEMBERS FOR INTEGRATION ON CONCENTRATING ELEMENTS FOR SOLAR CELLS

(75) Inventor: Alelie Funcell, Milpitas, CA (US)

(73) Assignee: Solaria Corporation, Fremont, CA (US)

( * ) Notice: Subject to any disclaimer, the term of this patent is extended or adjusted under 35 U.S.C. 154(b) by 572 days.

This patent is subject to a terminal disclaimer.

(21) Appl. No.: 11/252,399

(22) Filed: Oct. 17, 2005

(51) Int. Cl.
*H01L 31/18* (2006.01)

(52) U.S. Cl. ........... 136/259; 136/251; 156/553; 439/78

(58) Field of Classification Search .......... 136/243–293; 439/78, 81–83; 156/553
See application file for complete search history.

(56) References Cited

U.S. PATENT DOCUMENTS

| | | |
|---|---|---|
| 2,470,618 A | 5/1949 | Holden |
| 3,330,700 A | 7/1967 | Sequeira et al. |
| 3,446,676 A | 5/1969 | Goldsmith et al. |
| 3,575,721 A | 4/1971 | Mann |
| 3,597,050 A | 8/1971 | Plumat |
| 3,641,354 A | 2/1972 | De Ment |
| 3,700,714 A | 10/1972 | Hamilton et al. |
| 3,819,417 A | 6/1974 | Haynos |
| 3,849,880 A | 11/1974 | Haynos |
| 3,874,931 A | 4/1975 | Haynos |
| 3,951,633 A | 4/1976 | Danihel |
| 3,993,505 A | 11/1976 | Pack |
| 3,999,283 A | 12/1976 | Dean et al. |
| 4,029,519 A | 6/1977 | Schertz et al. |
| 4,056,405 A | 11/1977 | Varandi |

(Continued)

FOREIGN PATENT DOCUMENTS

AU 5544098 A1 8/1998

(Continued)

OTHER PUBLICATIONS

Boedeker Plastics, Inc.: Acrylic Polymethyl-MethAcrylate PMMA datasheet, http://www.boedeker.com/acryl.html; May 7, 1999; pp. 1-2.

(Continued)

*Primary Examiner* — Jeffrey T Barton
*Assistant Examiner* — J. Christopher Ball
(74) *Attorney, Agent, or Firm* — Richard T. Ogawa; Ogawa P.C.

(57) ABSTRACT

A solar cell device. The device has a first lead frame member including a first end and a second end and a second lead frame member coupled to the first lead frame member. In a specific embodiment, the second lead frame member includes a third end and a fourth end. The device also has a plurality of first bonding sites numbered from 1 through N between the first end and the second end of the first lead frame member, where N is an integer greater than 2. The device has a plurality of second bonding sites numbered from 1 through N between the third end and the fourth end, where N is an integer greater than 2. Depending upon the specific embodiment, the device has a plurality of photovoltaic regions numbered from 1 through N respectively bonded onto the plurality of first bonding sites numbered from 1 through N and second bonding sites numbered from 1 through N.

17 Claims, 9 Drawing Sheets

U.S. PATENT DOCUMENTS

| | | | |
|---|---|---|---|
| 4,091,798 A | 5/1978 | Selcuk | |
| 4,097,308 A | 6/1978 | Klein et al. | |
| 4,106,952 A * | 8/1978 | Kravitz | 136/206 |
| 4,118,249 A | 10/1978 | Graven et al. | |
| 4,122,833 A | 10/1978 | Selcuk | |
| 4,143,234 A | 3/1979 | Johnson et al. | |
| 4,166,917 A | 9/1979 | Dorfeld et al. | |
| 4,170,507 A | 10/1979 | Keeling et al. | |
| 4,174,978 A | 11/1979 | Lidorenko et al. | |
| 4,193,820 A | 3/1980 | Thomas | |
| 4,203,646 A | 5/1980 | Desso | |
| 4,239,555 A | 12/1980 | Scharlack et al. | |
| 4,257,821 A | 3/1981 | Kelly et al. | |
| 4,291,191 A | 9/1981 | Dahlberg | |
| 4,293,192 A | 10/1981 | Bronstein | |
| 4,295,463 A | 10/1981 | Citron | |
| 4,333,447 A | 6/1982 | Lemrow et al. | |
| 4,355,478 A | 10/1982 | Armstrong | |
| 4,361,136 A | 11/1982 | Huang | |
| 4,362,903 A | 12/1982 | Eichelberger et al. | |
| 4,404,422 A | 9/1983 | Green et al. | |
| 4,440,153 A | 4/1984 | Melchior | |
| 4,449,514 A | 5/1984 | Selcuk | |
| 4,454,371 A | 6/1984 | Folino | |
| 4,457,297 A | 7/1984 | Sobczak et al. | |
| 4,463,749 A | 8/1984 | Sobczak et al. | |
| 4,495,360 A | 1/1985 | Anthony | |
| 4,511,618 A | 4/1985 | Duchene et al. | |
| 4,562,637 A | 1/1986 | Kushima et al. | |
| 4,571,812 A | 2/1986 | Gee | |
| 4,589,191 A | 5/1986 | Green et al. | |
| 4,638,110 A | 1/1987 | Erbert | |
| 4,663,562 A | 5/1987 | Miller et al. | |
| 4,668,314 A | 5/1987 | Endoh et al. | |
| 4,680,074 A | 7/1987 | Schmitz et al. | |
| 4,683,154 A | 7/1987 | Benson et al. | |
| 4,691,994 A | 9/1987 | Tveryanovich | |
| 4,692,557 A | 9/1987 | Samuelson et al. | |
| 4,697,042 A | 9/1987 | Schilling | |
| 4,711,972 A | 12/1987 | O'Neill | |
| 4,830,038 A | 5/1989 | Anderson et al. | |
| 4,848,319 A | 7/1989 | Appeldorn | |
| 4,863,224 A | 9/1989 | Tveryanovich | |
| 4,953,577 A | 9/1990 | Marshall | |
| 4,964,713 A | 10/1990 | Goetzberger | |
| 4,999,059 A | 3/1991 | Bagno | |
| 5,006,179 A | 4/1991 | Gaddy et al. | |
| 5,011,544 A | 4/1991 | Gaddy et al. | |
| 5,043,198 A | 8/1991 | Maruyama et al. | |
| 5,080,725 A | 1/1992 | Green et al. | |
| 5,118,361 A | 6/1992 | Fraas et al. | |
| 5,153,780 A | 10/1992 | Jorgensen et al. | |
| 5,158,618 A | 10/1992 | Rubin et al. | |
| 5,167,724 A | 12/1992 | Chiang | |
| 5,174,275 A | 12/1992 | Holland | |
| 5,180,442 A * | 1/1993 | Elias | 136/251 |
| 5,180,888 A | 1/1993 | Sugiyama et al. | |
| 5,224,978 A | 7/1993 | Hermant et al. | |
| 5,240,510 A | 8/1993 | Goldade et al. | |
| 5,245,985 A | 9/1993 | Holland | |
| 5,261,970 A | 11/1993 | Landis et al. | |
| 5,344,496 A | 9/1994 | Stern et al. | |
| 5,356,488 A | 10/1994 | Hezel | |
| 5,365,920 A | 11/1994 | Lechner | |
| 5,395,070 A | 3/1995 | Wilk et al. | |
| 5,409,549 A * | 4/1995 | Mori | 136/244 |
| 5,436,725 A | 7/1995 | Ledger | |
| 5,449,626 A | 9/1995 | Hezel | |
| 5,460,659 A | 10/1995 | Krut | |
| 5,466,301 A | 11/1995 | Hammerbacher et al. | |
| 5,468,304 A | 11/1995 | Hammerbacher et al. | |
| 5,478,402 A | 12/1995 | Hanoka | |
| 5,498,297 A | 3/1996 | O'Neill et al. | |
| 5,508,205 A | 4/1996 | Dominguez et al. | |
| 5,517,339 A | 5/1996 | Riccobono et al. | |
| 5,529,054 A | 6/1996 | Shoen | |
| 5,542,409 A | 8/1996 | Sampayo | |
| 5,564,411 A | 10/1996 | Gerics | |
| 5,616,186 A | 4/1997 | Fraas et al. | |
| 5,660,644 A | 8/1997 | Clemens | |
| 5,665,607 A | 9/1997 | Kawama et al. | |
| 5,707,459 A | 1/1998 | Itoyama et al. | |
| 5,709,833 A | 1/1998 | Simone | |
| 5,735,966 A | 4/1998 | Luch | |
| 5,782,993 A | 7/1998 | Ponewash | |
| 5,787,878 A | 8/1998 | Ratliff, Jr. | |
| 5,790,304 A | 8/1998 | Sanders et al. | |
| 5,840,147 A | 11/1998 | Grimm | |
| 5,846,444 A | 12/1998 | Edwards et al. | |
| 5,851,309 A | 12/1998 | Kousa | |
| 5,865,905 A | 2/1999 | Clemens | |
| 5,877,874 A | 3/1999 | Rosenberg | |
| 5,882,434 A | 3/1999 | Horne | |
| 5,915,170 A | 6/1999 | Raab et al. | |
| 5,919,316 A | 7/1999 | Bogorad et al. | |
| 5,936,777 A | 8/1999 | Dempewolf | |
| 5,959,787 A * | 9/1999 | Fairbanks | 359/726 |
| 5,964,216 A | 10/1999 | Hoffschmidt et al. | |
| 6,008,449 A | 12/1999 | Cole | |
| 6,020,553 A | 2/2000 | Yogev | |
| 6,034,322 A | 3/2000 | Pollard | |
| 6,049,035 A | 4/2000 | Tsuri et al. | |
| 6,057,505 A | 5/2000 | Ortabasi | |
| 6,074,614 A | 6/2000 | Hafeman et al. | |
| 6,084,175 A | 7/2000 | Perry et al. | |
| 6,091,017 A | 7/2000 | Stern | |
| 6,091,020 A | 7/2000 | Fairbanks et al. | |
| 6,092,392 A | 7/2000 | Verlinden et al. | |
| 6,093,757 A | 7/2000 | Pern | |
| 6,107,564 A | 8/2000 | Aguilera et al. | |
| 6,118,067 A | 9/2000 | Lashley et al. | |
| 6,134,784 A | 10/2000 | Carrie et al. | |
| 6,150,602 A | 11/2000 | Campbell | |
| 6,167,724 B1 | 1/2001 | Pozivil | |
| 6,242,685 B1 | 6/2001 | Mizukami et al. | |
| 6,252,155 B1 | 6/2001 | Ortabasi | |
| 6,264,510 B1 | 7/2001 | Onizuka | |
| 6,274,402 B1 | 8/2001 | Verlinden et al. | |
| 6,274,860 B1 | 8/2001 | Rosenberg | |
| 6,293,803 B1 | 9/2001 | Rust et al. | |
| 6,294,723 B2 | 9/2001 | Uematsu et al. | |
| 6,309,901 B1 | 10/2001 | Tahon et al. | |
| 6,315,575 B1 | 11/2001 | Kajimoto | |
| 6,320,116 B1 | 11/2001 | Hanoka | |
| 6,323,415 B1 | 11/2001 | Uematsu et al. | |
| 6,333,457 B1 | 12/2001 | Mulligan et al. | |
| 6,333,458 B1 | 12/2001 | Forrest et al. | |
| 6,337,283 B1 | 1/2002 | Verlinden et al. | |
| 6,359,209 B1 | 3/2002 | Glenn et al. | |
| 6,365,823 B1 | 4/2002 | Kondo | |
| 6,387,726 B1 | 5/2002 | Verlinden et al. | |
| 6,395,972 B1 * | 5/2002 | Tran et al. | 136/251 |
| 6,423,568 B1 | 7/2002 | Verlinden et al. | |
| 6,429,037 B1 | 8/2002 | Wenham et al. | |
| 6,433,913 B1 | 8/2002 | Bauer et al. | |
| 6,437,236 B2 | 8/2002 | Watanabe et al. | |
| 6,440,769 B2 | 8/2002 | Peumans et al. | |
| 6,441,297 B1 | 8/2002 | Keller | |
| 6,479,744 B1 | 11/2002 | Tsuzuki et al. | |
| 6,528,716 B2 | 3/2003 | Collette et al. | |
| 6,528,718 B2 | 3/2003 | Yoda et al. | |
| 6,609,836 B1 | 8/2003 | Antonelli et al. | |
| 6,612,705 B1 | 9/2003 | Davidson et al. | |
| 6,617,505 B2 | 9/2003 | Shimada | |
| 6,619,282 B1 | 9/2003 | Murtha | |
| 6,620,995 B2 | 9/2003 | Vasylyev et al. | |
| 6,639,733 B2 | 10/2003 | Minano et al. | |
| 6,641,868 B2 | 11/2003 | Abe et al. | |
| 6,666,207 B1 | 12/2003 | Arkas et al. | |
| 6,676,263 B2 | 1/2004 | Winston | |
| 6,700,054 B2 | 3/2004 | Cherney et al. | |
| 6,700,055 B2 | 3/2004 | Barone | |
| 6,758,609 B2 | 7/2004 | Fathi et al. | |
| 6,761,598 B2 | 7/2004 | Onizuka et al. | |
| 6,804,062 B2 | 10/2004 | Atwater et al. | |
| 6,809,250 B2 | 10/2004 | Gerson | |
| 6,815,070 B1 | 11/2004 | Burkle et al. | |

| | | | | | | |
|---|---|---|---|---|---|---|
| 6,822,157 | B2 | 11/2004 | Fujioka | CA | 2432300 | 6/2002 |
| 6,825,052 | B2 | 11/2004 | Eldridge et al. | CA | 2467112 | 6/2003 |
| 6,829,908 | B2 | 12/2004 | Bowden et al. | DE | 298 23 351 U1 | 6/1999 |
| 6,843,573 | B2 | 1/2005 | Rabinowitz et al. | EP | 0029721 | 6/1981 |
| 6,849,797 | B2 | 2/2005 | Koyanagi et al. | EP | 461124 B1 | 5/1995 |
| 6,903,261 | B2 | 6/2005 | Habraken et al. | EP | 784870 | 4/1996 |
| 6,958,868 | B1 | 10/2005 | Pender | EP | 657948 A3 | 6/1997 |
| 7,019,207 | B2 | 3/2006 | Harneit et al. | EP | 1 030 376 A1 | 8/2000 |
| 7,055,519 | B2 | 6/2006 | Litwin | EP | 1174342 A1 | 1/2002 |
| 7,071,134 | B2 | 7/2006 | Koyama et al. | EP | 1261039 A1 | 11/2002 |
| 7,144,598 | B2 | 12/2006 | Moravec et al. | EP | 1131586 B1 | 3/2003 |
| 7,156,666 | B2 | 1/2007 | Mann | EP | 1342259 A1 | 9/2003 |
| 7,190,110 | B2 | 3/2007 | Tokai et al. | EP | 1112597 B1 | 3/2004 |
| 7,250,209 | B2 | 7/2007 | Shibahara et al. | EP | 1 427 025 A2 | 6/2004 |
| 7,282,240 | B1 | 10/2007 | Jackman et al. | EP | 1461834 A1 | 9/2004 |
| 7,309,831 | B2 | 12/2007 | Yamada | EP | 1 630 875 A2 | 3/2006 |
| 7,338,146 | B2 * | 3/2008 | Morikoshi ............... 347/29 | EP | 1732141 A1 | 12/2006 |
| 7,423,083 | B2 | 9/2008 | Kawaguchi et al. | GB | 1187969 | 4/1970 |
| 7,595,543 | B2 | 9/2009 | Weber et al. | IL | 156166 | 12/2003 |
| 2002/0007845 | A1 | 1/2002 | Collette et al. | JP | 61044741 A | 3/1986 |
| 2002/0018308 | A1 | 2/2002 | Winston | JP | 09018031 | 1/1997 |
| 2002/0075579 | A1 | 6/2002 | Vasylyev et al. | JP | 10104547 A2 | 4/1998 |
| 2002/0139414 | A1 | 10/2002 | Vasylyev et al. | WO | WO 9118420 A1 | 11/1991 |
| 2003/0015233 | A1 | 1/2003 | Barone | WO | WO 9406046 A1 | 3/1994 |
| 2003/0016539 | A1 | 1/2003 | Minano et al. | WO | WO 9506330 A1 | 3/1995 |
| 2003/0021897 | A1 | 1/2003 | Abe et al. | WO | WO 9533220 A1 | 12/1995 |
| 2003/0037569 | A1 | 2/2003 | Arbab et al. | WO | WO 9623115 A1 | 8/1996 |
| 2003/0037814 | A1 | 2/2003 | Cohen et al. | WO | WO 9624954 A1 | 8/1996 |
| 2003/0074976 | A1 | 4/2003 | Ahmad | WO | WO 9803823 A1 | 1/1998 |
| 2003/0081333 | A1 | 5/2003 | Winston | WO | WO 9832164 A1 | 7/1998 |
| 2003/0095340 | A1 | 5/2003 | Atwater et al. | WO | WO 9905462 A1 | 2/1999 |
| 2003/0121542 | A1 | 7/2003 | Harneit et al. | WO | WO 0074147 A1 | 12/2000 |
| 2003/0156337 | A1 | 8/2003 | Davidson et al. | WO | WO 0079593 A1 | 12/2000 |
| 2003/0201007 | A1 | 10/2003 | Fraas et al. | WO | WO 0151962 A2 | 7/2001 |
| 2003/0228114 | A1 | 12/2003 | Fathi et al. | WO | WO 0155650 A3 | 8/2001 |
| 2003/0228417 | A1 | 12/2003 | Nishikawa et al. | WO | WO 0190661 A3 | 11/2001 |
| 2004/0004216 | A1 | 1/2004 | Eldridge et al. | WO | WO 0208058 A1 | 1/2002 |
| 2004/0016454 | A1 | 1/2004 | Murphy et al. | WO | WO 0245143 A1 | 6/2002 |
| 2004/0021964 | A1 | 2/2004 | Rabinowitz et al. | WO | WO 02075225 A2 | 9/2002 |
| 2004/0084077 | A1 | 5/2004 | Aylaian | WO | WO 0155650 C2 | 10/2002 |
| 2004/0092668 | A1 | 5/2004 | Kawaguchi et al. | WO | WO 02095838 A1 | 11/2002 |
| 2004/0097012 | A1 * | 5/2004 | Weber et al. ............... 438/113 | WO | WO 03019083 A1 | 3/2003 |
| 2004/0108813 | A1 | 6/2004 | Tokai et al. | WO | WO 03022578 A1 | 3/2003 |
| 2004/0123895 | A1 | 7/2004 | Kardauskas et al. | WO | WO 03047004 A1 | 6/2003 |
| 2004/0134531 | A1 | 7/2004 | Habraken et al. | WO | WO 03049201 A1 | 6/2003 |
| 2004/0194820 | A1 | 10/2004 | Barone | WO | WO 03107078 A2 | 12/2003 |
| 2004/0229394 | A1 | 11/2004 | Yamada | WO | WO 2004100252 A1 | 11/2004 |
| 2004/0243364 | A1 | 12/2004 | Wendelin et al. | WO | WO 2006/015430 A1 | 2/2006 |
| 2004/0246605 | A1 | 12/2004 | Stiles et al. | WO | WO 2006/089540 A2 | 8/2006 |
| 2005/0070059 | A1 | 3/2005 | Blakers et al. | WO | WO 2006/123194 A1 | 11/2006 |
| 2005/0081908 | A1 | 4/2005 | Stewart | WO | WO 2006/128417 A1 | 12/2006 |
| 2005/0081909 | A1 | 4/2005 | Paull | WO | WO 2006/133126 A2 | 12/2006 |
| 2005/0087294 | A1 | 4/2005 | Rabinowitz | WO | WO 2007/036199 A2 | 4/2007 |
| 2005/0133082 | A1 | 6/2005 | Konold et al. | | | |
| 2006/0054211 | A1 | 3/2006 | Meyers et al. | | | |
| 2006/0099833 | A1 | 5/2006 | Mann | | | |
| 2006/0105897 | A1 | 5/2006 | Kasuga et al. | | | |
| 2006/0207646 | A1 | 9/2006 | Terreau et al. | | | |
| 2006/0235717 | A1 | 10/2006 | Sharma et al. | | | |
| 2006/0266406 | A1 | 11/2006 | Faust et al. | | | |
| 2006/0272698 | A1 | 12/2006 | Durvasula | | | |
| 2006/0283495 | A1 | 12/2006 | Gibson | | | |
| 2007/0056626 | A1 | 3/2007 | Funcell | | | |
| 2007/0095386 | A1 | 5/2007 | Gibson | | | |
| 2007/0153354 | A1 | 7/2007 | Duston et al. | | | |
| 2007/0251568 | A1 | 11/2007 | Maeda | | | |
| 2008/0060696 | A1 | 3/2008 | Ho et al. | | | |
| 2008/0197376 | A1 | 8/2008 | Bert et al. | | | |
| 2008/0236650 | A1 | 10/2008 | Gibson et al. | | | |
| 2008/0236655 | A1 | 10/2008 | Baldwin et al. | | | |
| 2008/0236664 | A1 | 10/2008 | Gibson et al. | | | |
| 2008/0241479 | A1 | 10/2008 | Nghiem et al. | | | |
| 2008/0314438 | A1 | 12/2008 | Tran et al. | | | |

FOREIGN PATENT DOCUMENTS

| | | |
|---|---|---|
| AU | 743826 B2 | 2/2002 |
| AU | 220348 A5 | 6/2002 |
| AU | 3902270 A4 | 5/2003 |
| AU | 2349175 | 6/2003 |

OTHER PUBLICATIONS

Solar Electricity Beginner Notes, http://www.sunwindsolar.com/a_lessons/solar_beginner_notes.html; Jan. 8, 2004; pp. 1-2.

ACLAR Fluropolymer Film by SPI Supplies, http://web.archive.org/web/20021022180352/http://www.2spi.com/catalog/photo/acalr-film.shtml, 3 pages.

Andreev et al., "Concentrator PV Modules of "All-Glass" Design With Modified Structure;" Paper 3P-C3-72 presented at WCPEC-3, Osaka Japan; May 11-18, 2003; 4 pages.

Breeze, A.J., et al., "Improving power efficiencies in polymer-polymer blend photvoltaics", Solar Energy Materials & Solar Cells, 83, 2004, pp. 263-271.

3M Glass Bubbles, Product Catalogue for 3M Energy and Advance Materials, Feb. 18, 2009, pp. 1-3.

Emissivity Values for Common Materials, http://www.infrared-thermography.com/ materials-1.htm, retrieved on Apr. 2, 2010, 4 pages.

King et al. "Photovoltaic Module Performance and Durability Following Long-Term Field Exposure", Prog. Photovol: Res. and Appl., vol. 8, No. 2, p. 241-256 (May 23, 2000).

Marayuma, T., et al. "Wedge-shaped light concentrator using total internal reflection", Solar Energy Materials & Solar Cells, 57, (1999), pp. 75-83.

Nitto Denko, Web page: http://www.nitto.com/ product/datasheet/037/index.html as updated on Apr. 18, 2005 from Internet Archive, 2 pages.
Pern et al, "Photothermal Stability of an E-Beam Pre-Crosslinked EVA Encapsulant and Its Performance Degradation on a-Si Submodules", NREL/CP-520-31026, Oct. 2001, Lakewood, Colorado, 4 pages.
Petrie, "Additives in Radiation (EB/UV) Cured Adhesive Formulations" www.specialchem4adhesives.com, Oct. 14, 2002, 6 pages.
Photovoltaic/Solar Panel Laminations; MADICO, http://www.madico.com/specialty_pv.asp; Jun. 11, 2007; pp. 1-2.
Wells, G.M., et al. "Effects of mirror surface roughness on exposure field uniformity in synchrontron x-ray lithography", American Vacuum Society, J. Vac. Sci. Technol., 1991, pp. 3227-3231.
International Search Report and Written Opinion for PCT Application No. PCT/US2010/024943, mailed Apr. 22, 2010, 9 pages.
International Search Report and Written Opinion for PCT Application No. PCT/US08/71127, mailed Oct. 22, 2008, 9 pages.
International Search Report and Written Opinion for PCT Application No. PCT/US2008/059170 mailed Aug. 6, 2008, 8 pages.
International Search Report and Written Opinion for PCT Application No. PCT/US2008/075134 mailed Dec. 5, 2008, 9 pages.
International Search Report and Written Opinion for PCT Application No. PCT/US2008/064132 mailed Aug. 15, 2008, 8 pages.
International Search Report and Written Opinion for PCT Application No. PCT/US 08/59167, mailed on Dec. 8, 2008, 11 pages.
International Search Report and Written Opinion for PCT Application No. PCT/US06/35793, mailed on May 10, 2007, 8 pages.
International Search Report and Written Opinion of PCT Application No. PCT/US06/29164, mailed on Jun. 5, 2008, 16 pages total.
International Search Report and Written Opinion for PCT Application No. PCT/US06/21803, dated Aug. 30, 2007, 21 pages total.
Office Action for U.S. Appl. No. 11/445,933 dated Apr. 14, 2010, 7 pages.
Office Action for U.S. Appl. No. 11/445,933 dated Oct. 14, 2009, 8 pages.
Office Action for U.S. Appl. No. 11/445,948 dated Apr. 15, 2010, 27 pages.
Office Action for U.S. Appl. No. 11/445,948 dated May 22, 2009, 18 pages.
Office Action for U.S. Appl. No. 11/354,530 dated Jan. 6, 2010, 7 pages.
Office Action for U.S. Appl. No. 11/493,380 dated Jul. 22, 2009, 22 pages.
Office Action for U.S. Appl. No. 11/493,380 dated Feb. 17, 2009, 24 pages.
Office Action for U.S. Appl. No. 11/493,380 dated May 30, 2008, 25 pages.
Office Action for U.S. Appl. No. 12/136,572 dated Feb. 4, 2010, 15 pages.
Office Action for U.S. Appl. No. 12/136,574 dated Jan. 12, 2010, 15 pages.
Office Action for U.S. Appl. No. 12/136,574 dated Jun. 8, 2009, 10 pages.
Office Action for U.S. Appl. No. 12/136,574 dated Dec. 29, 2008, 9 pages.
Office Action for U.S. Appl. No. 12/136,577 dated Jun. 8, 2009, 12 pages.
Office Action for U.S. Appl. No. 12/136,581 dated Feb. 4, 2010, 13 pages.
Office Action for U.S. Appl. No. 11/402,490 dated Oct. 30, 2009, 12 pages.
Office Action for U.S. Appl. No. 11/402,490 dated Mar. 3, 2009, 18 pages.
Office Action for U.S. Appl. No. 12/167,198 dated Dec. 19, 2008, 15 pages.
Office Action for U.S. Appl. No. 11/254,114 dated Feb. 2, 2010, 10 pages.
Office Action for U.S. Appl. No. 11/253,182 dated Feb. 5, 2010, 6 pages.
Office Action for U.S. Appl. No. 11/253,182 dated Jan. 8, 2009, 14 pages.
Office Action for U.S. Appl. No. 11/252,425 dated Oct. 16, 2009, 6 pages.
Office Action for U.S. Appl. No. 11/252,425 dated Mar. 19, 2009, 6 pages.
Office Action for U.S. Appl. No. 11/252,425 dated Jul. 9, 2008, 6 pages.
Office Action for U.S. Appl. No. 11/253,418 dated Sep. 11, 2009, 20 pages.
Office Action for U.S. Appl. No. 11/253,202 dated Aug. 31, 2009, 19 pages.
Office Action for U.S. Appl. No. 11/253,202 dated Feb. 19, 2009, 22 pages.
Office Action for U.S. Appl. No. 11/254,041 dated Jan. 26, 2010, 8 pages.
Office Action for U.S. Appl. No. 11/290,313 dated Apr. 15, 2010, 10 pages.
Office Action for U.S. Appl. No. 11/290,313 dated Sep. 21, 2009 7 pages.
Office Action for U.S. Appl. No. 11/753,546 dated Mar. 31, 2010, 10 pages.
Office Action for U.S. Appl. No. 12/060,801 dated Apr. 13, 2010, 24 pages.
Office Action for U.S. Appl. No. 12/332,340 dated Apr. 26, 2010, 17 pages.
Office Action for U.S. Appl. No. 11/841,899 of Mar. 11, 2008, 18 pages.

* cited by examiner

"TOP VIEW" FIGURE 2E

"SIDE VIEW" FIGURE 2F

SECTION A-A
FIGURE 5

METHOD AND RESULTING STRUCTURE FOR ASSEMBLING PHOTOVOLTAIC REGIONS ONTO LEAD FRAME MEMBERS FOR INTEGRATION ON CONCENTRATING ELEMENTS FOR SOLAR CELLS

BACKGROUND OF THE INVENTION

The present invention relates generally to solar energy techniques. In particular, the present invention provides a method and resulting device fabricated from a plurality of photovoltaic regions provided within one or more substrate members. More particularly, the present invention provides a method and resulting device for manufacturing the photovoltaic regions within the substrate member, which is coupled to a plurality of concentrating elements, using a coupling technique between the photovoltaic regions and respective concentrating elements. More particularly, the present invention provides a method and resulting structure of assembling photovoltaic regions onto a lead frame member, which facilitates assembly of the resulting structure onto one or more concentrating elements of a solar cell. Merely by way of example, the invention has been applied to solar panels, commonly termed modules, but it would be recognized that the invention has a much broader range of applicability.

As the population of the world increases, industrial expansion has lead to an equally large consumption of energy. Energy often comes from fossil fuels, including coal and oil, hydroelectric plants, nuclear sources, and others. As merely an example, the International Energy Agency projects further increases in oil consumption, with developing nations such as China and India accounting for most of the increase. Almost every element of our daily lives depends, in part, on oil, which is becoming increasingly scarce. As time further progresses, an era of "cheap" and plentiful oil is coming to an end. Accordingly, other and alternative sources of energy have been developed.

Concurrent with oil, we have also relied upon other very useful sources of energy such as hydroelectric, nuclear, and the like to provide our electricity needs. As an example, most of our conventional electricity requirements for home and business use comes from turbines run on coal or other forms of fossil fuel, nuclear power generation plants, and hydroelectric plants, as well as other forms of renewable energy. Often times, home and business use of electrical power has been stable and widespread.

Most importantly, much if not all of the useful energy found on the Earth comes from our sun. Generally all common plant life on the Earth achieves life using photosynthesis processes from sun light. Fossil fuels such as oil were also developed from biological materials derived from energy associated with the sun. For human beings including "sun worshipers," sunlight has been essential. For life on the planet Earth, the sun has been our most important energy source and fuel for modern day solar energy.

Solar energy possesses many characteristics that are very desirable! Solar energy is renewable, clean, abundant, and often widespread. Certain technologies developed often capture solar energy, concentrate it, store it, and convert it into other useful forms of energy. An example of one of these technologies includes solar panels, which are composed of a plurality of solar cells made of silicon bearing materials. An example of such solar cells can be found by those manufactured by Sun Power Corporation of California, as well as other companies.

Solar panels have been developed to convert sunlight into energy. As merely an example, solar thermal panels often convert electromagnetic radiation from the sun into thermal energy for heating homes, running certain industrial processes, or driving high grade turbines to generate electricity. As another example, solar photovoltaic panels convert sunlight directly into electricity for a variety of applications. Solar panels are generally composed of an array of solar cells, which are interconnected to each other. The cells are often arranged in series and/or parallel groups of cells in series. Accordingly, solar panels have great potential to benefit our nation, security, and human users. They can even diversify our energy requirements and reduce the world's dependence on oil and other potentially detrimental sources of energy.

Although solar panels have been used successful for certain applications, there are still certain limitations. Solar cells are often costly. Depending upon the geographic region, there are often financial subsidies from governmental entities for purchasing solar panels, which often cannot compete with the direct purchase of electricity from public power companies. Additionally, the panels are often composed of silicon bearing wafer materials.

Such wafer materials are often costly and difficult to manufacture efficiently on a large scale. Availability of solar panels is also somewhat scarce. That is, solar panels are often difficult to find and purchase from limited sources of photovoltaic silicon bearing materials. These and other limitations are described throughout the present specification, and may be described in more detail below.

From the above, it is seen that techniques for improving solar devices is highly desirable.

BRIEF SUMMARY OF THE INVENTION

According to the present invention, techniques related to solar energy are provided. In particular, the present invention provides a method and resulting device fabricated from a plurality of photovoltaic regions provided within one or more substrate members. More particularly, the present invention provides a method and resulting device for manufacturing the photovoltaic regions within the substrate member, which is coupled to a plurality of concentrating elements, using a coupling technique between the photovoltaic regions and respective concentrating elements More particularly, the present invention provides a method and resulting structure of assembling photovoltaic regions onto a lead frame member, which facilitates assembly of the resulting structure onto one or more concentrating elements of a solar cell. Merely by way of example, the invention has been applied to solar panels, commonly termed modules, but it would be recognized that the invention has a much broader range of applicability.

In a specific embodiment, the present invention provides a method for fabricating a solar cell. The method includes providing a first lead frame member including a first end and a second end. The method includes providing a second lead frame member including a third end and a fourth end. Depending upon the embodiment, the first lead frame and second lead frame can be coupled to each other or be separated from each other. In a specific embodiment, the method includes holding the first lead frame member and the second lead frame member. The method includes applying a glue material (e.g., solder paste, epoxy) onto at least a plurality of first bonding sites numbered from 1 through N and onto at least a plurality of second bonding sites numbered from 1 through N, where N is an integer greater than 2. The method attaches a plurality of photovoltaic regions numbered from 1 through N respectively onto the plurality of first bonding sites numbered from 1 through N and second bonding sites numbered from 1 through N according to a specific embodiment.

The method includes forming a resulting plurality of photovoltaic regions. In a specific embodiment, each of the photovoltaic regions is coupled between the first lead frame member and the second lead frame member.

In an alternative specific embodiment, the present invention provides a solar cell device. The device has a first lead frame member including a first end and a second end and a second lead frame member coupled to the first lead frame member. In a specific embodiment, the second lead frame member includes a third end and a fourth end. The device also has a plurality of first bonding sites numbered from 1 through N between the first end and the second end of the first lead frame member, where N is an integer greater than 2. The device has a plurality of second bonding sites numbered from 1 through N between the third end and the fourth end, where N is an integer greater than 2. Depending upon the specific embodiment, the device has a plurality of photovoltaic regions numbered from 1 through N respectively bonded onto the plurality of first bonding sites numbered from 1 through N and second bonding sites numbered from 1 through N.

Many benefits are achieved by way of the present invention over conventional techniques. For example, the present technique provides an easy to use process that relies upon conventional technology such as silicon materials, although other materials can also be used. Additionally, the method provides a process that is compatible with conventional process technology without substantial modifications to conventional equipment and processes. Preferably, the invention provides for an improved solar cell, which is less costly and easy to handle. Such solar cell uses a plurality of photovoltaic regions, which are provided on one or more lead frame members to be coupled to concentrating elements according to a preferred embodiment. In a preferred embodiment, the invention provides a method and completed solar cell structure using a plurality of photovoltaic strips free and clear from a module or panel assembly, which are provided during a later assembly process. Also in a preferred embodiment, one or more of the solar cells have less silicon per area (e.g., 80% or less, 50% or less) than conventional solar cells. In preferred embodiments, the present method and cell structures are also light weight and not detrimental to building structures and the like. That is, the weight is about the same or slightly more than conventional solar cells at a module level according to a specific embodiment. In a preferred embodiment, the present solar cell using the plurality of photovoltaic strips can be used as a "drop in" replacement of conventional solar cell structures. As a drop in replacement, the present solar cell can be used with conventional solar cell technologies for efficient implementation according to a preferred embodiment. In a preferred embodiment, the present invention provides a resulting structure that is reliable and can withstand environmental conditions overtime. Depending upon the embodiment, one or more of these benefits may be achieved. These and other benefits will be described in more detail throughout the present specification and more particularly below.

Various additional objects, features and advantages of the present invention can be more fully appreciated with reference to the detailed description and accompanying drawings that follow.

DETAILED DESCRIPTION OF THE INVENTION

According to the present invention, techniques related to solar energy are provided. In particular, the present invention provides a method and resulting device fabricated from a plurality of photovoltaic regions provided within one or more substrate members. More particularly, the present invention provides a method and resulting device for manufacturing the photovoltaic regions within the substrate member, which is coupled to a plurality of concentrating elements. More particularly, the present invention provides a method and resulting structure of assembling photovoltaic regions onto a lead frame member, which facilitates assembly of the resulting structure onto one or more concentrating elements of a solar cell. Merely by way of example, the invention has been applied to solar panels, commonly termed modules, but it would be recognized that the invention has a much broader range of applicability.

A method for fabricating a solar cell structure according to an embodiment of the present invention may be outlined as follows:
1. Provide a first lead frame member, including a first end and a second end, and a second lead frame member, including a third end and a fourth end;
2. Load the first lead frame member and the second lead frame member on an alignment jig or jigs, each of the lead frame members being in parallel to each other;
3. Apply a first blocking member exposing a plurality of first bonding sites between the first end and the second end;
4. Apply a second blocking member exposing a plurality of second bonding sites between the third end and the fourth end;
5. Print glue material within the exposed plurality of first bonding sites and within the exposed plurality of second bonding sites;

6. Remove the first blocking member and the second blocking member;
7. Place in sequence first through N photovoltaic strips respectively on first and second bonding sites numbered from 1 through N, where N is an integer greater than 2;
8. Provide a second substrate member comprising a plurality of optical concentrating elements numbered from 1 through N;
9. Couple the optical concentrating elements respectively to the plurality of photovoltaic strips with an elastomer material defined between each of the plurality of photovoltaic strips and each of the optical concentrating elements;
10. Cure the optical elastomer material to form a solar cell structure; and
11. Perform other steps, as desired.

The above sequence of steps provides a method according to an embodiment of the present invention. As shown, the method uses a combination of steps including a way of forming a solar cell for a solar panel, which has a plurality of solar cells. More particularly, the present invention provides a method of assembling a plurality of photovoltaic regions onto one or more lead frame structures to be coupled to a plurality of concentrating elements for a solar cell. Other alternatives can also be provided where steps are added, one or more steps are removed, or one or more steps are provided in a different sequence without departing from the scope of the claims herein. Further details of the present method and resulting structures can be found throughout the present specification and more particularly below.

Figure 1:
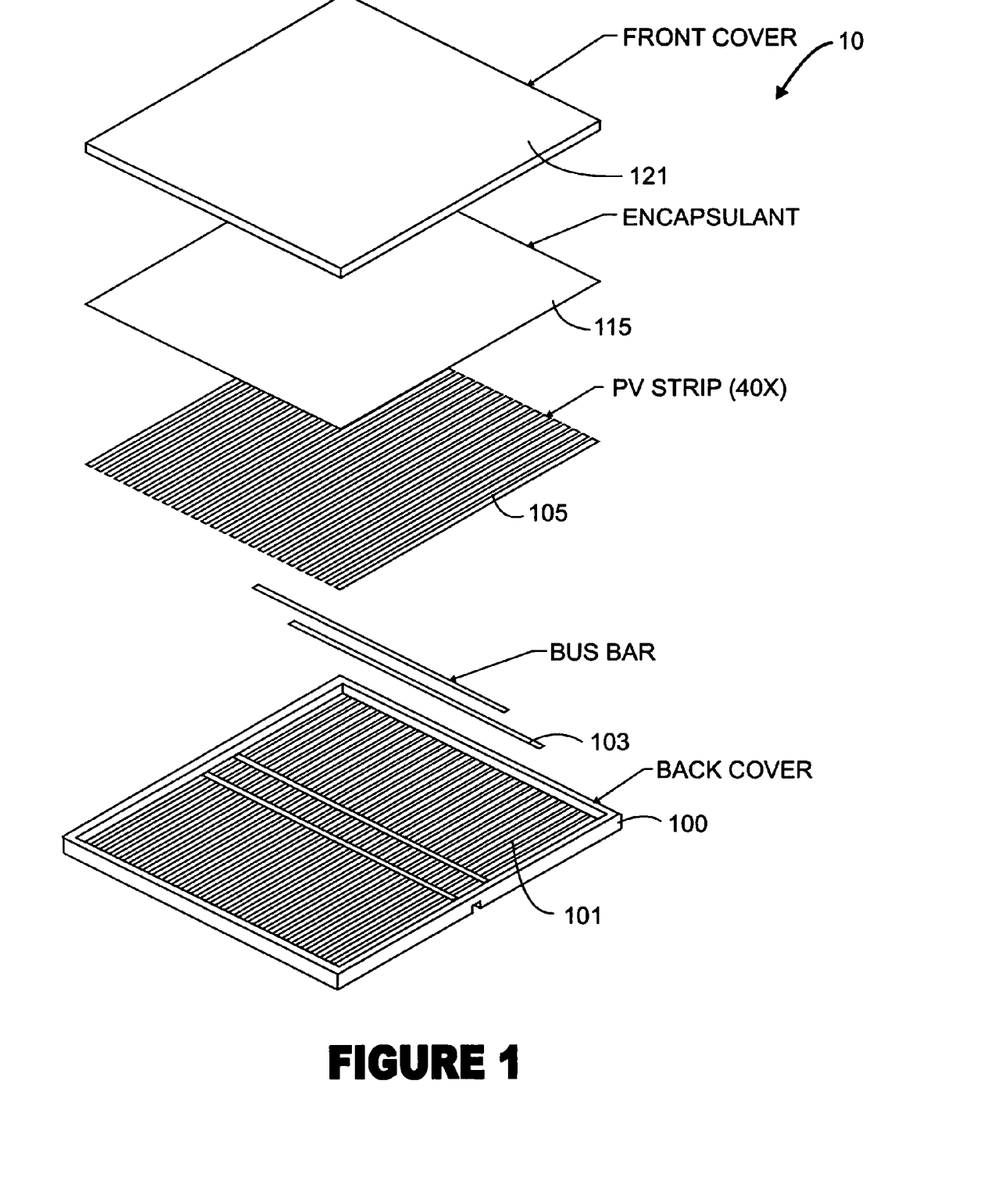
FIG. 1 is a simplified diagram illustrating an expanded view of a solar cell structure according to an embodiment of the present invention.

Referring now to FIG. 1, an expanded view 10 of a solar cell structure according to an embodiment of the present invention is illustrated. This diagram is merely an example, which should not unduly limit the scope of the claims herein. One of ordinary skill in the art would recognize many variations, modifications, and alternatives. As shown is an expanded view of the present solar cell device structure, which includes various elements. The device has a back cover member 101, which includes a surface area and a back area. The back cover member also has a plurality of sites, which are spatially disposed, for electrical members, such as bus bars, and a plurality of photovoltaic regions. In a specific embodiment, the bus bars can be provided on a lead frame structure, which will be described in more detail throughout the present specification and more particularly below. Of course, there can be other variations, modifications, and alternatives.

In a preferred embodiment, the device has a plurality of photovoltaic strips 105, each of which is disposed overlying the surface area of the back cover member. In a preferred embodiment, the plurality of photovoltaic strips correspond to a cumulative area occupying a total photovoltaic spatial region, which is active and converts sunlight into electrical energy. Of course, there can be other variations, modifications, and alternatives.

An encapsulating material 115 is overlying a portion of the back cover member. That is, an encapsulating material forms overlying the plurality of strips, and exposed regions of the back cover, and electrical members. In a preferred embodiment, the encapsulating material can be a single layer, multiple layers, or portions of layers, depending upon the application. Of course, there can be other variations, modifications, and alternatives.

In a specific embodiment, a front cover member 121 is coupled to the encapsulating material. That is, the front cover member is formed overlying the encapsulant to form a multilayered structure including at least the back cover, bus bars, plurality of photovoltaic strips, encapsulant, and front cover.

In a preferred embodiment, the front cover includes one or more concentrating elements, which concentrate (e.g., intensify per unit area) sunlight onto the plurality of photovoltaic strips. That is, each of the concentrating elements can be associated respectively with each of or at least one of the photovoltaic strips.

Upon assembly of the back cover, bus bars, photovoltaic strips, encapsulant, and front cover, an interface region is provided along at least a peripheral region of the back cover member and the front cover member. The interface region may also be provided surrounding each of the strips or certain groups of the strips depending upon the embodiment. The device has a sealed region and is formed on at least the interface region to form an individual solar cell from the back cover member and the front cover member. The sealed region maintains the active regions, including photovoltaic strips, in a controlled environment free from external effects, such as weather, mechanical handling, environmental conditions, and other influences that may degrade the quality of the solar cell. Additionally, the sealed region and/or sealed member (e.g., two substrates) protect certain optical characteristics associated with the solar cell and also protects and maintains any of the electrical conductive members, such as bus bars, interconnects, and the like. Details of sealing the assembly together can be found in U.S. patent application Ser. No. 60/688,077, commonly assigned, and hereby incorporated by reference for all purposes. Of course, there can be other benefits achieved using the sealed member structure according to other embodiments.

In a preferred embodiment, the total photovoltaic spatial region occupies a smaller spatial region than the surface area of the back cover. That is, the total photovoltaic spatial region uses less silicon than conventional solar cells for a given solar cell size. In a preferred embodiment, the total photovoltaic spatial region occupies about 80% and less of the surface area of the back cover for the individual solar cell. Depending upon the embodiment, the photovoltaic spatial region may also occupy about 70% and less or 60% and less or preferably 50% and less of the surface area of the back cover or given area of a solar cell. Of course, there can be other percentages that have not been expressly recited according to other embodiments. Here, the terms "back cover member" and "front cover member" are provided for illustrative purposes, and not intended to limit the scope of the claims to a particular configuration relative to a spatial orientation according to a specific embodiment. Further details of various elements in the solar cell can be found throughout the present specification and more particularly below. More particularly, certain details on coupling each of the photovoltaic regions to the concentrating elements can be found throughout the present specification and more particularly below.

Figure 2:
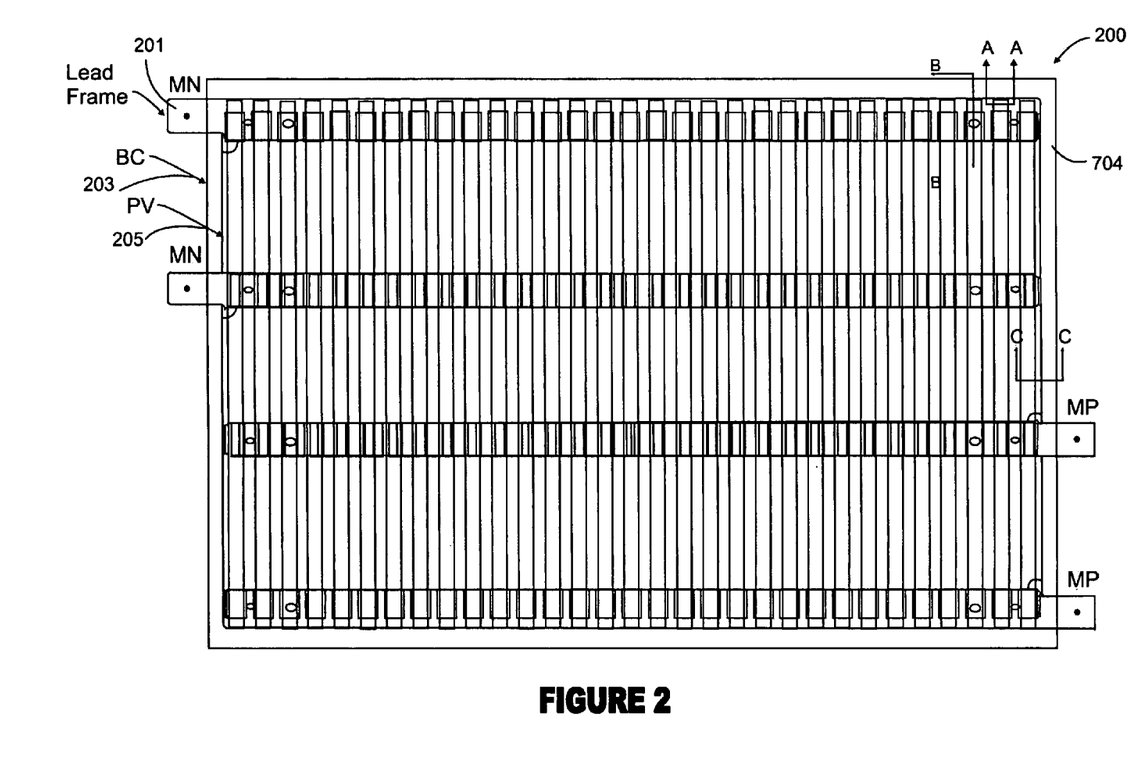
FIG. 2 is a simplified top-view diagram of a solar cell according to an embodiment of the present invention.
Figure 2A:
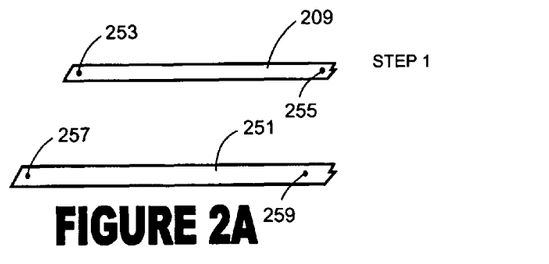
FIGS. 2A through 2D are simplified diagrams illustrating a method of assembly photovoltaic regions onto a pair of lead frame structures according to an embodiment of the present invention.

FIG. 2 is a simplified top-view diagram 200 of a solar cell according to an embodiment of the present invention. This diagram is merely an example, which should not unduly limit the scope of the claims herein. One of ordinary skill in the art would recognize many variations, modifications, and alternatives. In an alternative specific embodiment, the present invention provides a solar cell device. The device has a housing member, which is a back cover member 203. The device also has a lead frame member 201 coupled to the housing member. In a specific embodiment, the lead frame member can be selected from a copper member and/or an Alloy 42 member. Of course, there can be other variations, modifications, and alternatives.

In a preferred embodiment, the lead frame member has at least one photovoltaic strip 205 thereon, which has a surface region and a back side region. In a specific embodiment, each of the photovoltaic strips is made of a silicon bearing material, which includes a photo energy conversion device therein. That is, each of the strips is made of single crystal and/or poly crystalline silicon that have suitable characteristics to cause it to convert applied sunlight or electromagnetic radiation into electric current energy according to a specific embodiment. An example of such a strip is called the Sliver Cell® product manufactured by Origin Energy of Australia, but can be others. In other examples, the strips or regions of photovoltaic material can be made of other suitable materials such as other semiconductor materials, including semiconductor elements listed in the Periodic Table of Elements, polymeric materials that have photovoltaic properties, or any combination of these, and the like. In a specific embodiment, the photovoltaic region is provided on the lead frame using a conductive epoxy paste and/or solder adhesive, including paste and/or other bonding techniques. Of course, there can be other variations, modifications, and alternatives.

In a specific embodiment, the device has an optical elastomer material having a first thickness overlying the surface region of the photovoltaic surface. The elastomer material is an optical elastomer material, which begins as a liquid (e.g., paste, soft paste) and cures to form a solid material, e.g., pliable. That is, a refractive index of the elastomer material is substantially matched to a overlying concentrating element according to a specific embodiment. In a specific embodiment, the encapsulant material adapts for a first coefficient of thermal expansion of the plurality of photovoltaic strips on the lead frame member and a second coefficient of thermal expansion associated with the concentrating element. In a specific embodiment, the encapsulant material facilitates transfer of one of more photons between one of the concentrating elements and one of the plurality of photovoltaic strips. The encapsulant material can act as a barrier material, an electrical isolating structure, a glue layer, and other desirable features. The encapsulating material can also be a tape and/or film according to a specific embodiment. Depending upon the embodiment, the encapsulant material can be cured using a thermal, ultraviolet, and/or other process according to a specific embodiment. Of course, there can be other variations, modifications, and alternatives. In a specific embodiment, the device has a second substrate member comprising at least one optical concentrating element thereon. Further details of the concentrating element and other features can be found in the figures described below. Additionally, further details of a lead frame structure coupled to a plurality of photovoltaic regions are provided throughout the present specification and more particularly below.

FIGS. 2A through 2D are simplified diagrams illustrating a method of assembly photovoltaic regions onto a pair of lead frame structures according to an embodiment of the present invention. These diagrams are merely examples, which should not unduly limit the scope of the claims herein. One of ordinary skill in the art would recognize many variations, modifications, and alternatives. As shown, the method includes providing a first lead frame member 209 including a first end 253 and a second end 255. The method includes providing a second lead frame member 251 including a third end 257 and a fourth end 259. Depending upon the embodiment, the first lead frame and second lead frame can be coupled to each other or be separated from each other. In a specific embodiment, each of the lead frame members has a thickness, length, and width. Additionally, each of the lead frame members can be made of suitable material including copper, copper alloy, Alloy 42, and others according to a specific embodiment. As shown, each of the lead frames are in parallel alignment with each other. Further details of the lead frame member can be found throughout the present specification and more particularly below.

Figure 2B:
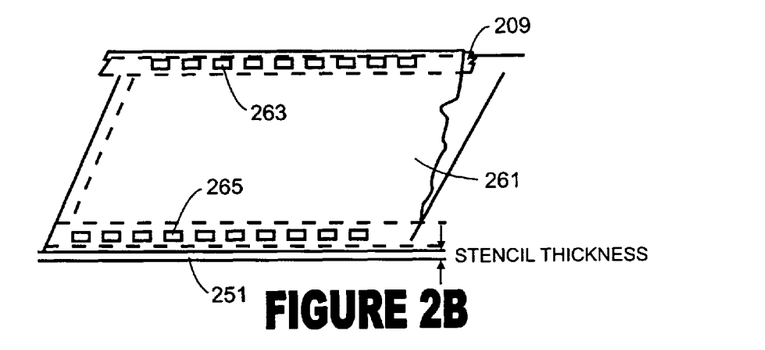

In a specific embodiment, the method includes holding the first lead frame member and the second lead frame member. Referring to FIG. 2B, the method includes placing a blocking layer 261 overlying each of the lead frame members according to a specific embodiment. The blocking layer can be any suitable material such as a stencil, photo resist material, and others according to a specific embodiment. The stencil can be made of a plastic, metal, glass, or other suitable material depending upon the specific embodiment. The stencil can include a plurality of openings 263 associated with the first lead frame member and a plurality of openings 265 associated with the second lead frame member according to a specific embodiment. Depending upon the embodiment, the plurality of first openings corresponds respectively to a plurality of bonding sites for the first lead frame member. The plurality of second openings corresponds respectively to a plurality of bonding sites for the second lead frame member according to a specific embodiment.

Referring again to FIG. 2B, the method includes applying a glue material (e.g., solder paste, epoxy) onto at least the plurality of first bonding sites, which can be numbered from 1 through N, and onto at least the plurality of second bonding sites, which can be numbered from 1 through N, where N is an integer greater than 2. Further details on applying the glue layer can be found throughout the present specification and more particularly below. Depending upon the embodiment, the blocking layer is removed to expose the glue material, which will be provided for at least one of the next processes.

Figure 2C:
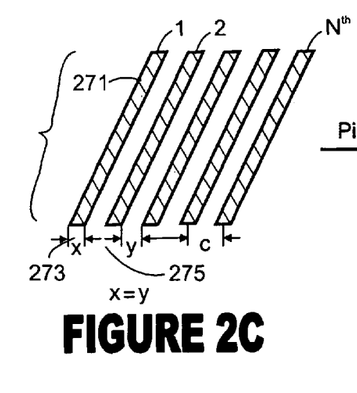

Referring to FIG. 2C, the method provides a plurality of photovoltaic regions, which are arranged in strips 271. Each of the strips has a width 273, length, and thickness, according to a specific embodiment. Each of the strips has been separated from a larger wafer structure according to a specific embodiment. Each of the strips is separated from an adjacent strip by a predetermined width 275 according to a specific embodiment. As shown, each of the plurality of strips have been arranged on a tape and/or electron sheet according to a specific embodiment. Each of the strips have been expanded on the tape and/or sheet according to a specific embodiment. In a specific embodiment, the tape and/or sheet can be provided on a mechanical support structure such as a ring structure or the like. Of course, there can be other variations, modifications, and alternatives.

Figure 2D:
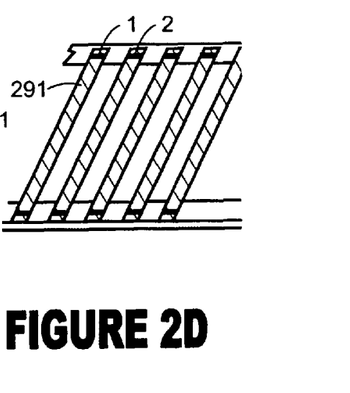

Referring to FIGS. 2C and 2D, the method uses a pick and place process to remove each of the strips and places it onto a pair of bonding sites on the first and second lead frame members according to a specific embodiment. In a preferred embodiment, the method picks up each of the strips in a sequential manner and places it also in the same sequential manner, as shown. That is, each of the strips is separated from a larger wafer and maintained in a sequential order, which is the same order as the plurality of strips provided on the lead frame members according to a specific embodiment of the present invention. As shown, the method attaches a plurality of photovoltaic regions numbered from 1 through N respectively onto the plurality of first bonding sites numbered from 1 through N and second bonding sites numbered from 1 through N according to a specific embodiment. As shown, the method forms a resulting plurality of photovoltaic regions. In a specific embodiment, each of the photovoltaic regions is coupled between the first lead frame member and the second lead frame member. Of course, there can be other variations, modifications, and alternatives.

Figure 2E:
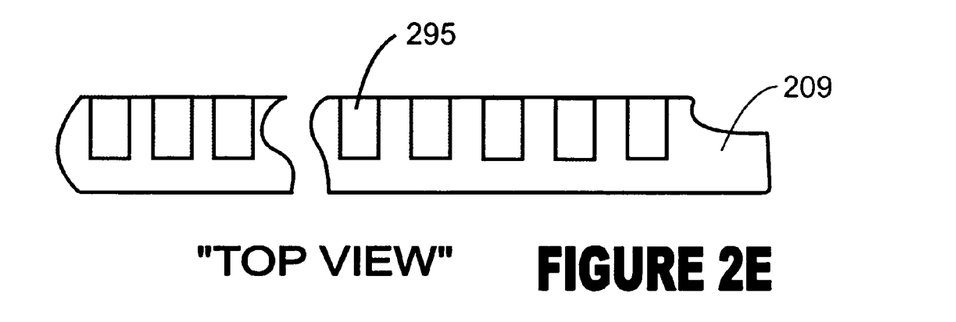
FIG. 2E is a simplified top view diagram of a lead frame member according to an embodiment of the present invention.

FIG. 2E is a simplified top view diagram of a lead frame member 209 according to an embodiment of the present invention. This diagram is merely an example, which should not unduly limit the scope of the claims herein. One of ordinary skill in the art would recognize many variations, modifications, and alternatives. As shown, the lead frame member has a plurality of bonding sites 295, which are each recessed slightly below the surface of the lead frame member according to a preferred embodiment. Further details of the recess are provided throughout the present specification and more particularly below.

Figure 2F:
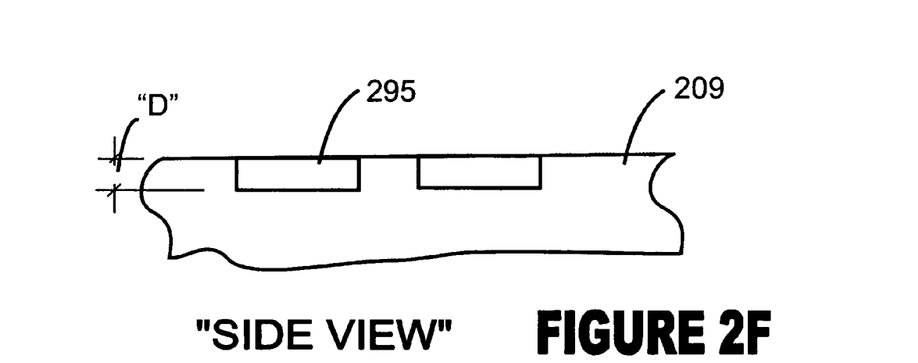
FIG. 2F is a simplified side view diagram of a lead frame member according to an embodiment of the present invention.

FIG. 2F is a simplified side view diagram of a lead frame member 209 according to an embodiment of the present invention. This diagram is merely an example, which should not unduly limit the scope of the claims herein. One of ordinary skill in the art would recognize many variations, modifications, and alternatives. As shown, the lead frame member has a recessed region 295, which will physically hold an end of a photovoltaic region or strip according to an embodiment of the present invention. Each of the recessed regions has a depth "D" that is a predetermined thickness of a thickness of the photovoltaic region according to a specific embodiment. The recessed region can be provided for alignment of the photovoltaic region and/or a site for solder paste or other glue material according to a specific embodiment. Depending upon the embodiment, the predetermined thickness can be greater, the same, or less than the thickness of the photovoltaic region. Of course, there can be other variations, modifications, and alternatives.

Figure 2G:
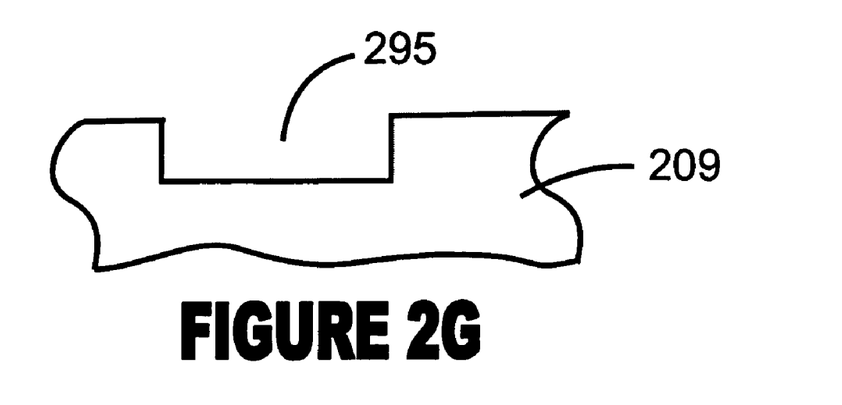
FIGS. 2G through 2I illustrates a method of provided a glue material on a portion of a lead frame according to an embodiment of the present invention.
Figure 2H:
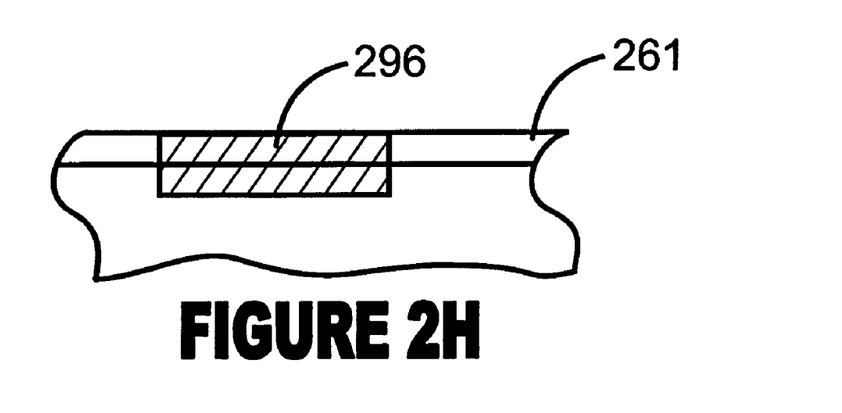
Figure 2I:
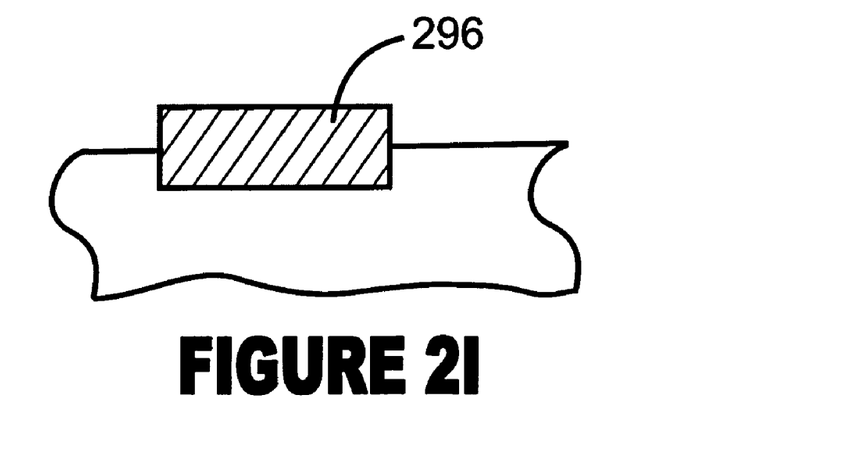

FIGS. 2G through 2I illustrates a method of provided a glue material on a portion of a lead frame according to an embodiment of the present invention. These diagrams are merely examples, which should not unduly limit the scope of the claims herein. One of ordinary skill in the art would recognize many variations, modifications, and alternatives. As shown, lead frame member 209 includes recessed region 295, which is one of a plurality of recessed regions. In a specific embodiment, the method includes providing blocking layer 261, which includes an opening to expose recessed region, as shown in FIG. 2H. Each of the openings corresponds to a bonding site, which will be for a portion of a photovoltaic region.

Depending upon the embodiment, the blocking layer can be a stencil, photo masking material, a single layer, multiple layers, any combination of these, and the like. A glue material 196 is formed overlying the exposed regions according to a specific embodiment. The stencil layer is removed to expose the glue material 296, which has a similar thickness relative the surface region of the lead frame as the thickness of the stencil layer, according to a specific embodiment. Depending upon the embodiment, the glue material can be an epoxy, a silver epoxy paste, a solder paste, and other materials. As merely an example, the glue material can be solder paste product manufactured and sold by Ablestick Corporation, SUMITOMO BAKELITE Co., Ltd., Loctite Corporation can be from other manufacturers, as well. Of course, there can be various modifications, alternatives, and variations.

Figure 3:
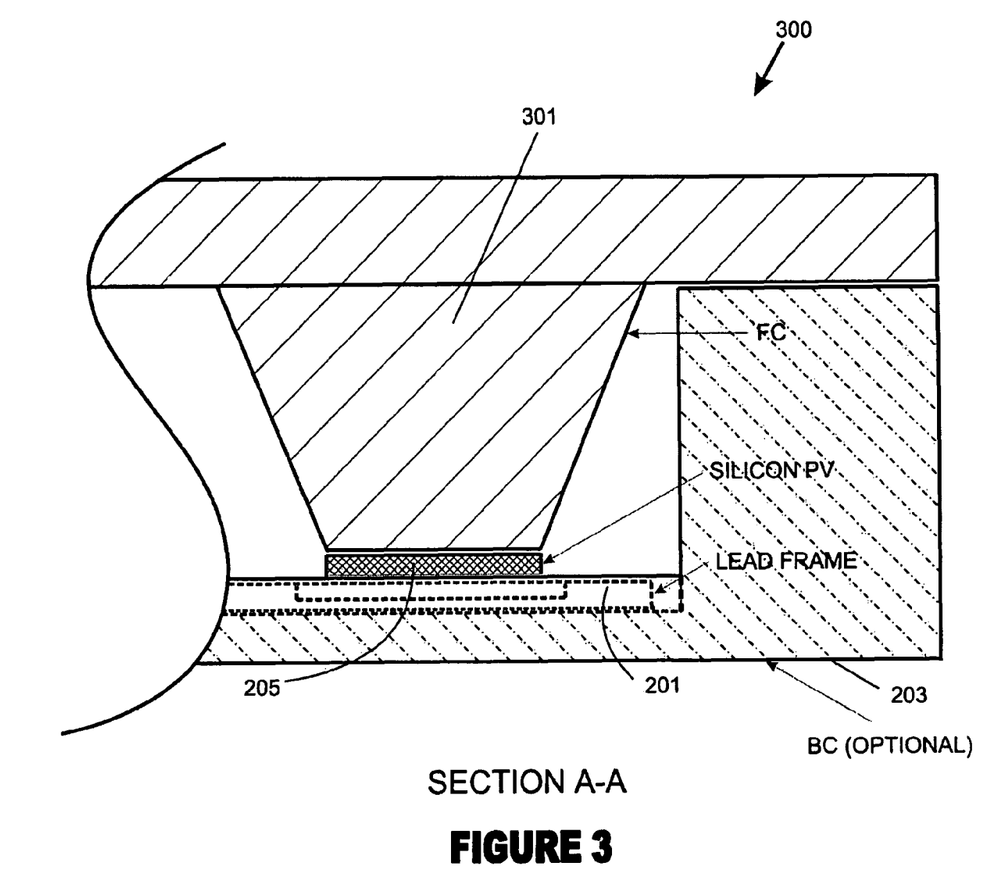
FIG. 3 is a detailed cross-sectional view diagram of a photovoltaic region coupled to a concentrating element of a solar cell according to an embodiment of the present invention.

FIG. 3 is a detailed cross-sectional view diagram 300 of a photovoltaic region coupled to a concentrating element of a solar cell according to an embodiment of the present invention. This diagram is merely an example, which should not unduly limit the scope of the claims herein. One of ordinary skill in the art would recognize many variations, modifications, and alternatives. As shown, FIG. 3 is a cross section of "SECTION A-A" illustrated in FIG. 2. As shown, the device has an optical concentrating element 301, which has a first side and a second side. The device also has other element including the back cover, photovoltaic region, lead frame, and others. Specific details of other views of the device are provided throughout the present specification and more particularly below.

Figure 4:
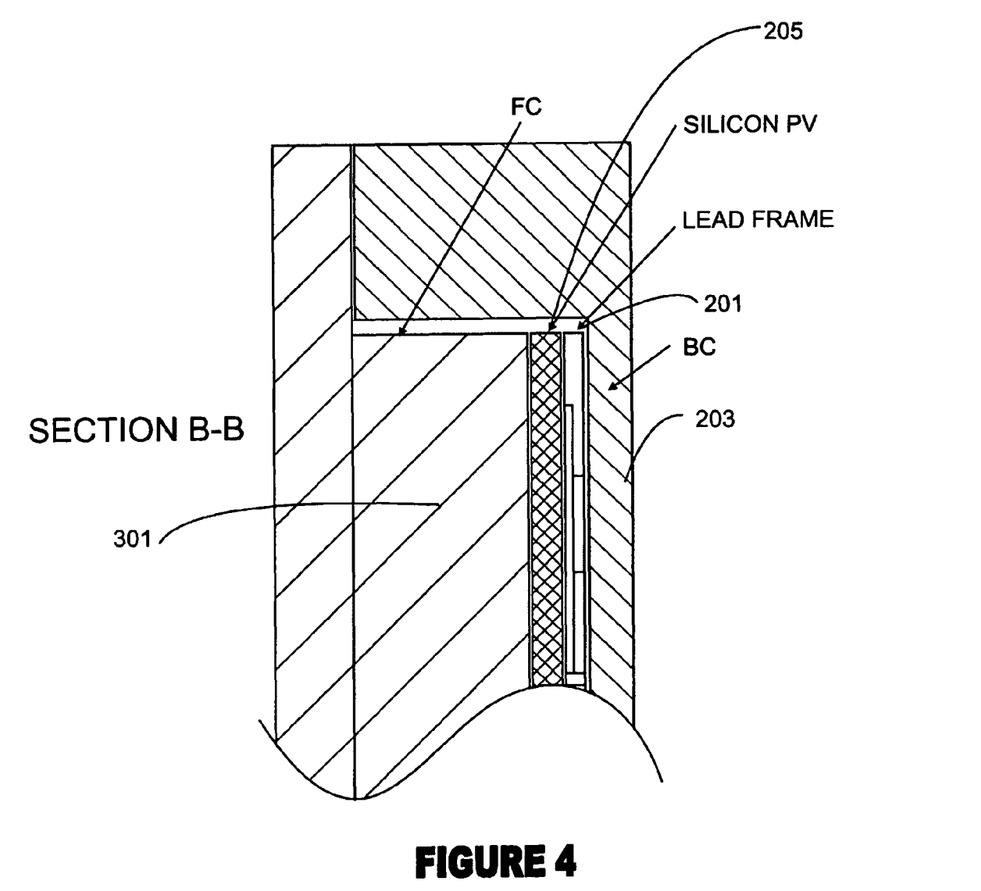
FIG. 4 is a detailed alternative cross-sectional view diagram of a photovoltaic region coupled to a concentrating element of a solar cell according to an embodiment of the present invention.

FIG. 4 is a detailed alternative cross-sectional view diagram 400 of a photovoltaic region coupled to a concentrating element of a solar cell according to an embodiment of the present invention. This diagram is merely an example, which should not unduly limit the scope of the claims herein. One of ordinary skill in the art would recognize many variations, modifications, and alternatives. As shown, FIG. 4 is a cross section of "SECTION B-B" illustrated in FIG. 2. As shown, the device has an optical concentrating element 301, which has a first side and a second side. The device also has other element including the back cover, photovoltaic region, lead frame, and others. Specific details of other views of the device are provided throughout the present specification and more particularly below.

Figure 5:
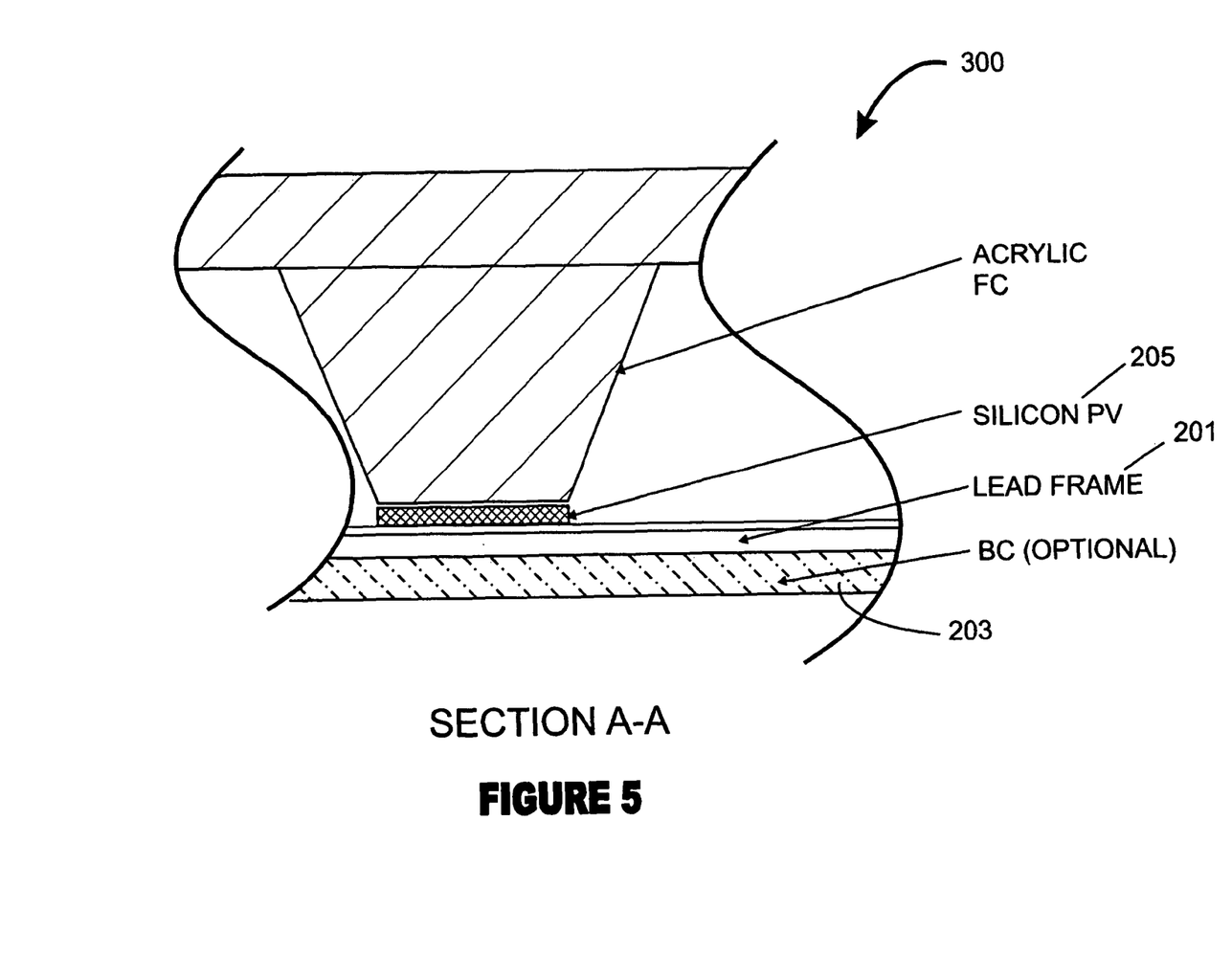
FIG. 5 is a detailed cross-sectional view diagram of a photovoltaic region coupled to a concentrating element of a solar cell according to an embodiment of the present invention.
Figure 5A:
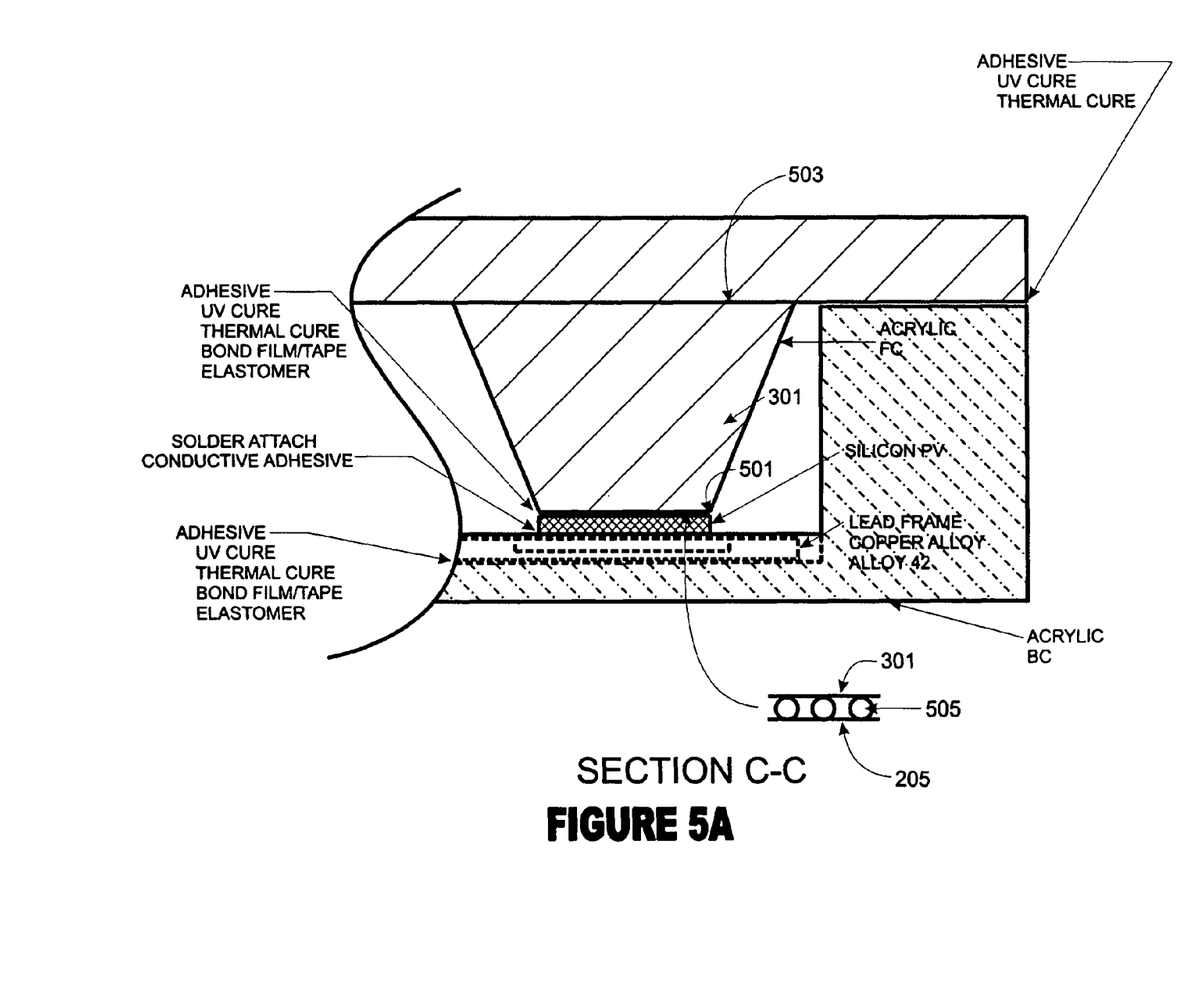
FIG. 5A is a larger detailed cross-sectional view diagram of the photovoltaic region coupled to the concentrating element of the solar cell of FIG. 5 according to an embodiment of the present invention.

FIG. 5 is a detailed cross-sectional view diagram of a photovoltaic region coupled to a concentrating element of a solar cell according to an embodiment of the present invention. This diagram is merely an example, which should not unduly limit the scope of the claims herein. One of ordinary skill in the art would recognize many variations, modifications, and alternatives. As shown, FIG. 5 is a cross section of "SECTION C-C" illustrated in FIG. 2. More specifically, FIG. 5A is a larger detailed cross-sectional view diagram of the photovoltaic region coupled to the concentrating element of the solar cell of FIG. 5 according to an embodiment of the present invention. This diagram is merely an example, which should not unduly limit the scope of the claims herein. One of ordinary skill in the art would recognize many variations, modifications, and alternatives. As shown, the device has an optical concentrating element 301, which has a first side 503 and a second side 501. The device also has other element including the back cover, photovoltaic region, lead frame, and others.

In a specific embodiment, the device has a first interface within a vicinity of the surface region and the first thickness of the optical elastomer material. The device also has a second interface within a vicinity of the second side and the optical elastomer material. In a specific embodiment, the optical concentrating element 301 is coupled to the surface region of the photovoltaic strip 205 such that the optical elastomer material is in between the surface region of the photovoltaic strip and the second side of the optical concentrating element. In a specific embodiment, the device has a spacing comprising essentially the optical elastomer material between the second side of the optical concentrating element and the surface region of the photovoltaic strip. The device has a plurality of particles 505 having a predetermined dimension (e.g., non-compressible and substantially non-deformable particles, spherical glass particles, which are substantially transparent) spatially disposed overlying the surface region of the photovoltaic strip and within a second thickness of the optical elastomer material to define the spacing between the surface region and the second side of the optical concentrating element. In a specific embodiment, the second thickness is the same as the first thickness, although they can differ in other embodiments. In a specific embodiment, the first interface is substantially free from one or more gaps (e.g., air gaps and/or pockets) and the second interface substantially free from one or more gaps to form a substantially continuous optical interface from the first side of the optical concentrating element, through the first interface, and through the second interface to the photovoltaic strip. Of course, there can be other variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating a resulting solar cell from a plurality of photovoltaic strips from a conventional solar cell, the solar cell having less than 60% less silicon per area than the conventional solar cell, the method comprising:
   providing the plurality of photovoltaic strips, each of the photovoltaic strips being characterized by a width and a length;
   providing a first lead frame member including a first end and a second end;
   providing a second lead frame member including a third end and a fourth end;
   holding the first lead frame member and the second lead frame member, the holding of the first lead frame member and the second lead frame member being characterized by a parallel alignment between the first lead frame member and the second lead frame member;
   providing at least a plurality of first bonding sites numbered from 1 through N on the first lead frame and onto at least a plurality of second bonding sites numbered from 1 through N on the second lead frame, where N is an integer greater than 2;
   arranging the plurality of photovoltaic strips, each of the plurality of photovoltaic strips being separated from an adjacent photovoltaic strip by a predetermined distance;
   providing a first blocking layer exposing the plurality of first bonding sites and providing a second blocking layer exposing the plurality of second bonding sites;
   dispensing glue material within the first bonding sites and within the second bonding sites;
   removing the first blocking layer and the second blocking layer leaving glue material within the plurality of first bonding sites and within the plurality of second bonding sites;
   attaching the plurality of photovoltaic strips numbered from 1 through N respectively onto the plurality of first bonding sites numbered from 1 through N and second bonding sites numbered from 1 through N;
   forming a resulting plurality of photovoltaic strips coupled between the first lead frame member and the second lead frame member; and
   coupling the resulting plurality of photo voltaic strips to a transparent front cover member, the transparent front cover member configured to receive incoming light and including a plurality of concentrator elements comprising transparent material, the plurality of photovoltaic strips being approximately aligned below the plurality of concentrator elements of the front cover member, respectively, to provide a resulting solar cell; and
   whereupon the resulting solar cell having 60% less silicon than the conventional solar cell.

2. The method of claim 1 wherein each of the plurality of first bonding sites is characterized by a recessed region.

3. The method of claim 1 wherein each of the plurality of second bonding sites is characterized by a recessed region.

4. The method of claim 1 wherein the glue material is an encapsulant material.

5. The method of claim 1 wherein the glue material is a solder paste.

6. The method of claim 1 further comprising curing the glue material to bond the plurality of photovoltaic strips onto the first lead frame member and the second lead frame member.

7. The method of claim 1 wherein each of the photovoltaic strips comprises a silicon bearing material.

8. The method of claim 1 wherein the first lead frame member and the second lead frame member comprise a copper material or an Alloy 42 material.

9. The method of claim 1 wherein the attaching comprises a pick and place process to remove each of the photovoltaic strips from a tape backing material and spatially disposing each of the photovoltaic strips onto each of the first lead frame member and the second lead frame member.

10. The method of claim 1 further comprising coupling the plurality of photovoltaic strips coupled to the first lead frame member and the second lead frame member respectively onto a plurality of optical concentrating elements.

11. The method of claim 10 wherein each of the plurality of optical concentrating elements is coupled at least one of the plurality of photovoltaic strips with an encapsulant material formed between the optical concentrating element and the photovoltaic strip.

12. The method of claim 1 wherein the first lead frame member is a first bus bar and the second lead frame member is a second bus bar.

13. The method of claim 1,
   wherein a top surface of the transparent front cover member is planar, wherein the plurality of concentrator elements comprises a volume of the transparent material bounded by a first surface, a second surface, and concentrating surfaces, wherein the first surface is larger than the second surface, wherein the first surface of the plurality of concentrator elements are approximately parallel to the top surface of the front cover member, wherein the second surface is approximately parallel to the plurality of photovoltaic strips, are wherein the concentrating surfaces couple the first surface to the second surface.

14. A method for fabricating a solar cell, the method comprising:
   providing a first lead frame member including a first end and a second end;
   providing a second lead frame member including a third end and a fourth end;
   holding the first lead frame member and the second lead frame member, the holding of the first lead frame member and the second lead frame member being characterized by a parallel alignment between the first lead frame member and the second lead frame member;
   providing at least a plurality of first bonding sites numbered from 1 through N on the first lead frame and onto at least a plurality of second bonding sites numbered from 1 through N on the second lead frame, where N is an integer greater than 2, each of the plurality of first bonding sites and each of the plurality of second bonding sites being characterized by a recessed region;
   providing a first blocking layer exposing the plurality of first bonding sites and providing a second blocking layer exposing the plurality of second bonding sites;
   dispensing glue material within the first bonding sites and within the second bonding sites;
   providing a plurality of photovoltaic strips derived from a photovoltaic cell structure, each of the photovoltaic strips being characterized by a width and a length;

arranging the plurality of photovoltaic strips, each of the plurality of photovoltaic strips being separated from an adjacent photovoltaic strip by a predetermined distance;

attaching the plurality of photovoltaic strips numbered from 1 through N respectively onto the plurality of first bonding sites numbered from 1 through N and second bonding sites numbered from 1 through N;

forming a resulting plurality of photovoltaic strips, each of the photovoltaic strips being coupled between the first lead frame member and the second lead frame member; and coupling the resulting plurality of photo voltaic strips to a transparent front cover member, the transparent front cover member configured to receive incoming light and including a plurality of concentrator elements comprising transparent material, the plurality of photovoltaic strips being approximately aligned below the plurality of concentrator elements of the front cover member.

15. The method of claim 14, wherein a top surface of the transparent front cover member is planar, wherein the plurality of concentrator elements comprises a volume of the transparent material bounded by a first surface, a second surface, and concentrating surfaces, wherein the first surface is larger than the second surface, wherein the first surface of the plurality of concentrator elements is approximately parallel to the top surface of the front cover member, wherein the second surface is approximately parallel to the plurality of photovoltaic strips, and wherein the concentrating surfaces couple the first surface to the second surface.

16. A method for fabricating a solar cell from a plurality of photovoltaic strips, each of the strips comprising a silicon material, the method comprising:

providing a first lead frame member including a first end and a second end;

providing a second lead frame member including a third end and a fourth end;

holding the first lead frame member and the second lead frame member, in parallel alignment;

providing at least a plurality of first bonding sites numbered from 1 through N on the first lead frame and on at least a plurality of second bonding sites numbered from 1 through N on the second lead frame, where N is an integer greater than 2;

providing a first blocking layer exposing the plurality of first bonding sites and providing a second blocking layer exposing the plurality of second bonding sites;

dispensing glue material within the first bonding sites and within the second bonding sites;

separating a photovoltaic solar cell into a plurality of photovoltaic strips;

arranging the plurality of photovoltaic strips so that each of the plurality of photovoltaic strips is separated from adjacent photovoltaic strips by a predetermined distance;

attaching the plurality of photovoltaic strips numbered from 1 through N respectively onto the plurality of first bonding sites numbered from 1 through N and second bonding sites numbered from 1 through N; and coupling the plurality of photovoltaic strips to a plurality of concentrator elements coupled to a front cover member coupling the resulting plurality of photo voltaic strips to a plurality of concentrator elements comprising transparent material coupled to a transparent front cover member, the transparent front cover member configured to receive incoming light, the plurality of photovoltaic strips being approximately aligned below the plurality of concentrator elements to form a resulting solar cell comprising the plurality of photovoltaic strips coupled to the concentrator elements.

17. The method of claim 16, wherein a top surface of the transparent front cover member is planar, wherein the plurality of concentrator elements comprises a volume of the transparent material bounded by a first surface, a second surface, and concentrating surfaces, wherein the first surface is larger than the second surface, wherein the first surface of the plurality of concentrator elements is approximately parallel to the top surface of the front cover member, wherein the second surface is approximately parallel to the plurality of photovoltaic strips, and wherein the concentrating surfaces couple the first surface to the second surface.

* * * * *